United States Patent
Daubenspeck et al.

(10) Patent No.: US 8,916,463 B2
(45) Date of Patent: Dec. 23, 2014

(54) WIRE BOND SPLASH CONTAINMENT

(75) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/604,878

(22) Filed: Sep. 6, 2012

(65) Prior Publication Data

US 2014/0061933 A1 Mar. 6, 2014

(51) Int. Cl.
H01L 21/44 (2006.01)
H01L 23/52 (2006.01)
H01L 23/48 (2006.01)

(52) U.S. Cl.
CPC .................................. *H01L 23/481* (2013.01)
USPC ............ 438/612; 438/617; 257/784; 257/779

(58) Field of Classification Search
CPC .................................................... H01L 23/481
USPC ........................... 438/612, 617; 257/784, 779
See application file for complete search history.

(56) References Cited

U.S. PATENT DOCUMENTS

| 5,110,361 | A |   | 5/1992  | Alley et al. |
| 5,172,212 | A | * | 12/1992 | Baba .............................. 257/738 |
| 5,249,450 | A |   | 10/1993 | Wood et al. |
| 5,530,278 | A |   | 6/1996  | Jedicka et al. |
| 6,656,828 | B1 |   | 12/2003 | Maitani et al. |
| 6,660,624 | B2 |   | 12/2003 | Tzeng et al. |
| 6,906,316 | B2 |   | 6/2005  | Sugiyama et al. |
| 7,508,012 | B2 |   | 3/2009  | Otremba |
| 7,601,628 | B2 |   | 10/2009 | Daubenspeck et al. |
| 7,736,920 | B1 |   | 6/2010  | Wu et al. |
| 7,843,069 | B2 |   | 11/2010 | Daubenspeck et al. |
| 2001/0000416 | A1 |   | 4/2001  | Uzoh |
| 2007/0017650 | A1 |   | 1/2007  | Bin Abdul Wahid |
| 2007/0275503 | A1 | * | 11/2007 | Lin et al. ....................... 438/106 |

(Continued)

FOREIGN PATENT DOCUMENTS

| JP | 11354583 A | 12/1999 |
| JP | 2003037110 A | 2/2003 |
| JP | 2011029314 A | 2/2011 |
| KR | 100256305 B1 | 2/2000 |

OTHER PUBLICATIONS

"Copper (Cu) Wire Bonding", 2012 Amkor Technology, 2003, http://www.amkor.com/go/packaging/copper-cu-wire-bonding, accessed Aug. 2, 2012, 3 pages.

(Continued)

*Primary Examiner* — Luan C Thai
(74) *Attorney, Agent, or Firm* — Michael LeStrange; Roberts Mlotkowski Safran & Cole, P.C.

(57) ABSTRACT

A splash containment structure for semiconductor structures and associated methods of manufacture are provided. A method includes: forming wire bond pads in an integrated circuit chip and forming at least one passivation layer on the chip. The at least one passivation layer includes first areas having a first thickness and second areas having a second thickness. The second thickness is greater than the first thickness. The first areas having the first thickness extend over a majority of the chip. The second areas having the second thickness are adjacent the wire bond pads.

25 Claims, 7 Drawing Sheets

(56) References Cited

U.S. PATENT DOCUMENTS

| | | |
|---|---|---|
| 2010/0015793 A1 | 1/2010 | Wang et al. |
| 2010/0181567 A1* | 7/2010 | Mun .............................. 257/48 |
| 2011/0101389 A1 | 5/2011 | Wu |
| 2011/0304046 A1 | 12/2011 | Kitazawa et al. |
| 2012/0061832 A1* | 3/2012 | Daubenspeck et al. ....... 257/738 |

OTHER PUBLICATIONS

Chen et al., "17.5um Thin Cu Wire Bonding for Fragile Low-K Wafer Technology", 2010 12th Electronics Packaging Technology Conference, IEEE, 2010, pp. 355-358.

Leng et al., "Ultra Fine Pitch Cu Wire Bonding on C45 Ultra Low k Wafer Technology", 2010 12th Electronics Packaging Technology Conference, IEEE, 2010, pp. 484-488.

* cited by examiner

FIG. 20

WIRE BOND SPLASH CONTAINMENT

FIELD OF THE INVENTION

The invention relates to semiconductor structures and methods of manufacture and, more particularly, to wire bond splash containment structures and methods of manufacture.

BACKGROUND

Many types of integrated circuit chips utilize wire bonding to electrically connect the circuit contained in the chip to the next higher level of packaging. Wire bonding involves forming bond pads at the periphery of the chip, and bonding an end of a respective wire to each one of the bond pads. The other end of each respective wire is connected to a contact on the next higher level of packaging. The bond pads are typically composed of aluminum, and the wires are typically composed of gold or copper.

Gold or copper wire bonding to an aluminum bond pad often creates aluminum 'splash' as a result of the ultrasonic scrubbing operation that is used to form the permanent bond between the wire and the bond pad. Copper wire bonding offers a cost-effective alternative to traditional gold wire bonding, but has an enhanced tendency to splash due to higher forces required during bonding.

Thus, with copper (Cu) wire bonding the splash concern drives the aluminum bond pad size to be larger than it would otherwise be for gold wire bonding. A metal splash defect creates a foreign material defect concern and can, in some cases, result in metal bridging causing electrical shorts between adjacent metal bond pads or between a bond pad and an adjacent wire. Metal splash has been observed on fabricated parts with sufficient size and density to suggest the potential for metal-to-metal shorting (e.g., shorting between adjacent bond pads).

Accordingly, there exists a need in the art to overcome the deficiencies and limitations described hereinabove.

SUMMARY

In a first aspect of the invention, a method of manufacturing a semiconductor structure includes forming wire bond pads in an integrated circuit chip and forming at least one passivation layer on the chip. The at least one passivation layer includes first areas having a first thickness and second areas having a second thickness. The second thickness is greater than the first thickness. The first areas having the first thickness extend over a majority of the chip. The second areas having the second thickness are adjacent the wire bond pads.

In another aspect of the invention, a method of forming a semiconductor structure includes forming wire bond pads in an integrated circuit chip and forming a passivation layer over the wire bond pads. The method also includes patterning the passivation layer to form: an area of a first thickness, an area of a second thickness greater than the first thickness, and openings over the wire bond pads. The area of the second thickness defines the openings. The area of the first thickness extends over a majority of the chip.

In another aspect of the invention, a method of forming a semiconductor structure includes forming wire bond pads in an integrated circuit chip, forming a first passivation layer over the wire bond pads, and patterning the first passivation layer to form a first area of a first thickness. The method also includes forming a second passivation layer on the first area and over the wire bond pads and patterning the second passivation layer to form openings over the wire bond pads and a second area of a second thickness. The second area of the second thickness is adjacent the openings.

In yet another aspect of the invention, a semiconductor structure includes wire bond pads over a substrate in an integrated circuit chip and a passivation layer over the substrate. The passivation layer includes a first area having a first thickness extending over a majority of the chip. The passivation layer also includes a second area having a second thickness greater than the first thickness and defining openings that are aligned with and over the wire bond pads.

In still another aspect of the invention, a semiconductor structure includes wire bond pads over a substrate in an integrated circuit chip. The semiconductor structure also includes a first passivation layer over the substrate and having a first area of a first thickness. The semiconductor structure additionally includes a second passivation layer on the first passivation layer and which defines a second area of a second thickness greater than the first thickness. The second area of the second thickness defines openings over and aligned with the bond pads.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a splash containment structure which comprises the structures of the present invention. In still further embodiments, a method in a computer-aided design system is provided for generating a functional design model of the splash containment structure. The method comprises generating a functional representation of the structural elements of the splash containment structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to wire bond splash containment structures and methods of manufacture. According to aspects of the invention, a containment structure is formed around bond pads, the containment structure being of sufficient height to prevent electrical shorting between bond pads due to the splash phenomenon. In embodiments, the containment structure comprises localized areas of increased thickness of a passivation layer. In this manner, implementations of the invention provide a splash containment structure that permits the bond pads to be made smaller, thus permitting decreased chip size.

Two embodiments of forming a splash containment structure are described herein, although it is understood that the invention is not limited to these two exemplary embodiments.

In accordance with a first embodiment, a passivation layer includes a single layer of photosensitive polyimide (PSPI) that is patterned using a single mask to create openings over bond pads and also to have areas of two different thicknesses. One of the two thicknesses corresponds to a conventional thickness of a PSPI passivation layer, while another one of the thicknesses is much greater (e.g., at least 2× greater) than the conventional thickness and forms a splash containment structure in the vicinity of the bond pads. The openings and two different thicknesses may be formed by exposing the PSPI of the passivation layer using a mask that has full transmissivity, zero transmissivity, and partial transmissivity areas.

In accordance with a second embodiment, a passivation layer includes two layers of PSPI that are separately formed, exposed, developed, and cured. The first layer of PSPI is formed to a conventional thickness. The second layer of PSPI is formed on the first layer, and is patterned to provide localized thicker portions of PSPI in the vicinity of the bond pads, thereby forming a splash containment structure for the bond pads.

Figure 1:
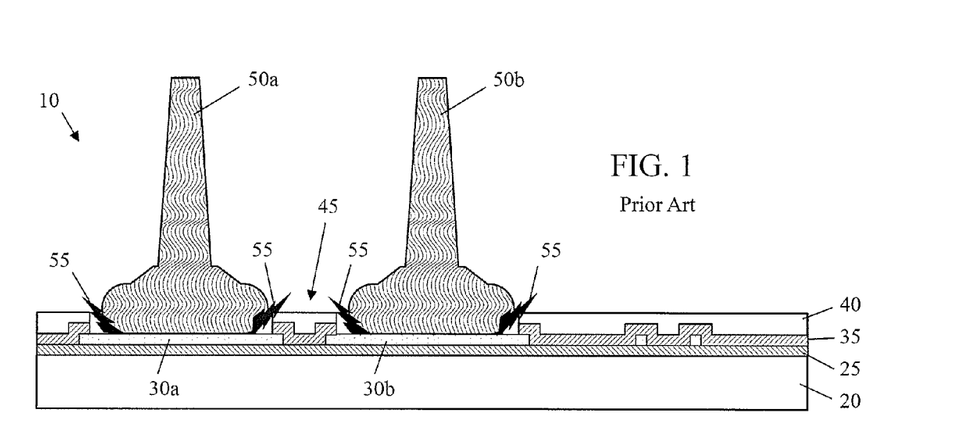
FIGS. 1-3 show a splash phenomenon associated with wire bonding.
Figure 2:
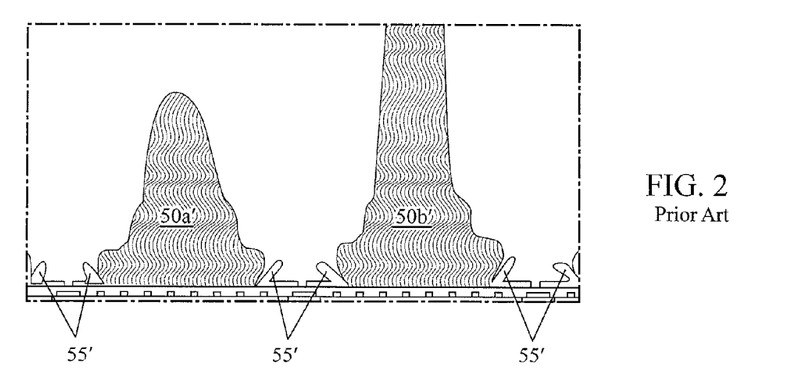
Figure 3:
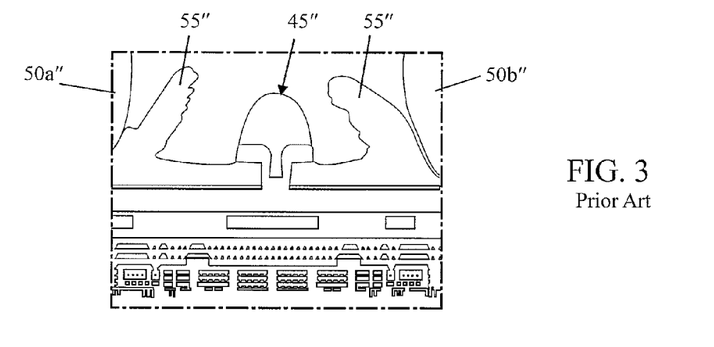

FIGS. 1-3 show a splash phenomenon associated with wire bonding. In particular, FIG. 1 shows an integrated circuit (IC) chip 10 comprising a substrate 20, a barrier layer 25, wire bond pads 30a and 30b, a hard dielectric layer 35, and a passivation layer 40. The hard dielectric layer 35 and passivation layer 40 are patterned to expose the upper surface of the bond pads 30a and 30b. The patterning of the hard dielectric layer 35 and passivation layer 40 results in a web 45 between adjacent bond pads 30a and 30b.

Still referring to FIG. 1, wire 50a is bonded to bond pad 30a, and wire 50b is bonded to bond pad 30b. The bonding of the wires 50a, 50b to the bond pads 30a, 30b can result in a solidified splash 55 of the material of the bond pads. The splash 55, if sufficiently large, can create an undesired electrical short between the bond pads 30a and 30b (or between one of the bond pads, e.g., 30a, and the other one of the wires, e.g., 50b).

FIGS. 2 and 3 show structures similar to that of FIG. 1. In particular, FIG. 2 shows an optical microscopic view of two wires 50a' and 50b' bonded to adjacent wire bond pads and splash structures 55' that are formed as a result of the wire bonding process. FIG. 3 shows a scanning electron microscope view of two wires 50a" and 50b" bonded to adjacent bond pads. FIG. 3 also shows splash structures 55" that extend higher than the web 45" between the adjacent bond pads. The splash that may occur during wire bonding thus has the potential to create an electrical short between adjacent bond pads and/or wires. Implementations of the invention prevent such shorting by providing a containment structure between bond pads, wherein the containment structure has a height that prevents splash of one bond pad from coming into contact with an adjacent wire or bond pad.

Figure 4:
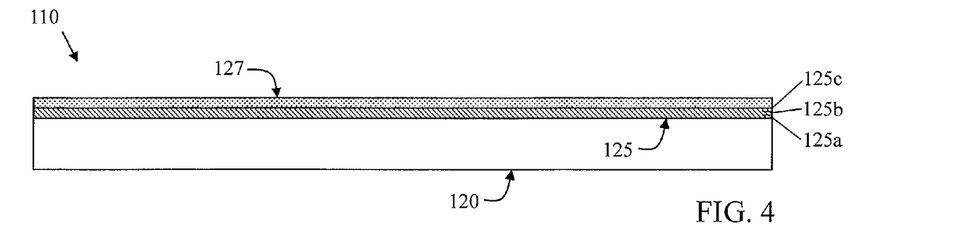
FIGS. 4-19 show processing steps and respective structures in accordance with aspects of the invention.

FIGS. 4-10 show processing steps and respective structures in accordance with aspects of the invention. In particular, FIG. 4 shows a cross section of a portion of a semiconductor structure, e.g., an integrated circuit chip 110 comprising a substrate 120 and a barrier layer 125 on the top surface of the substrate 120. The substrate 120 may comprise, for example, wires, interconnects, vias, and devices (e.g., transistors, capacitors, etc.) that form a circuit of the integrated circuit chip 110. The substrate 120 may be composed of any suitable material or combination of materials, such as plural wiring levels formed atop a semiconductor-on-insulator (SOI) or a bulk material substrate. The barrier layer 125 may comprise, for example, a plurality of layers of dielectric material including, but not limited to, a three layer stack comprising a first layer 125a of silicon nitride, a second layer 125b of silicon oxide, and a third layer 125c of silicon nitride. The barrier layer 125, whether a single layer or plural layers, may be formed on the top surface of the substrate 120 using conventional semiconductor materials and manufacturing processes.

Still referring to FIG. 4, a layer 127 of conductive material is formed on the barrier layer 125. The layer 127 may comprise any electrically conductive material that is suitable for forming wire bond pads. In embodiments, the layer 127 comprises aluminum and is about 3 μm to about 5 μm thick, although other materials and/or thicknesses may be used within the scope of the invention. The layer 127 may be formed using any suitable process, including, but not limited to chemical vapor deposition (CVD), sputtering, etc.

Figure 5:
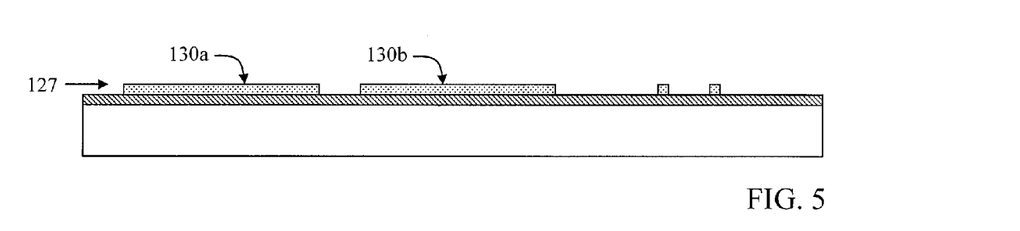

As depicted in FIG. 5, the layer 127 is patterned to form bond pads 130a and 130b. The layer 127 may be patterned in any suitable manner, including using photolithographic masking and etching processes. For example, a photomask may be provided by forming a layer of photoresist material on the layer 127, exposing the photoresist material to a pattern of light, and developing the exposed photoresist material. An etching process, such as a reactive ion etch (RIE), may then be used to form patterns (e.g., openings) in the layer 127 by removing portions of the layer 127 that are not covered by the photomask. After etching, the photomask may be removed using a conventional ashing or stripping process. The unetched portions of the layer 127 that remain after the masking and etching form the bond pads 130a and 130b. Although only two bond pads are shown, it is understood that any desired number of bond pads may be formed.

Figure 6:
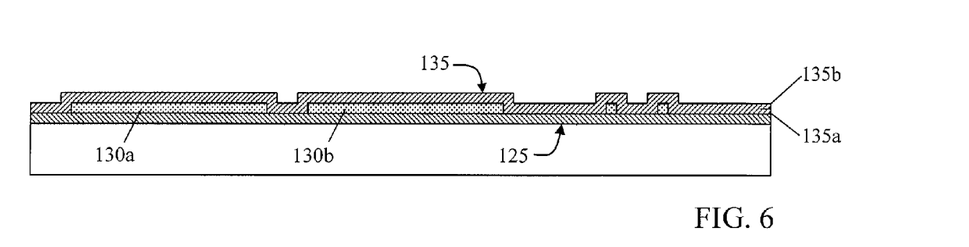

As depicted in FIG. 6, a hard dielectric layer 135 is formed on the bond pads 130a and 130b and on the exposed upper surfaces of the barrier layer 125. In embodiments, the hard dielectric layer 135 comprises a first hard dielectric layer 135a composed of silicon oxide and a second hard dielectric layer 135b composed of silicon nitride, each of which is conformally deposited (e.g., using CVD) and has a thickness of about 0.4 μm to about 0.5 μm. The hard dielectric layer 135 is not limited to this exemplary embodiment, however, and may comprise any suitable materials having any desired thickness and may be formed using other semiconductor manufacturing processes.

Figure 7:
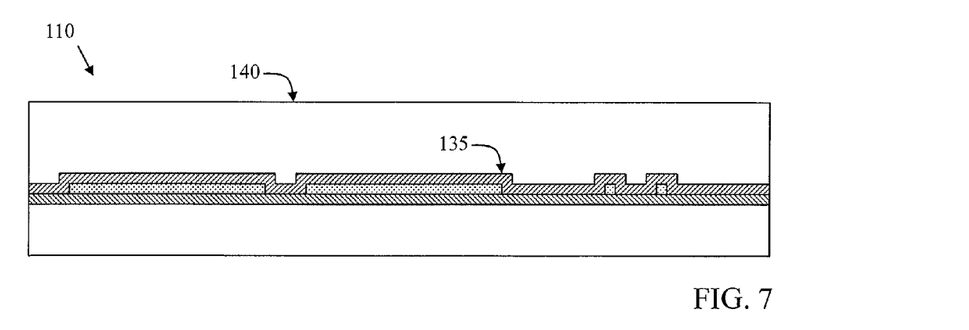

FIG. 7 shows the formation of a passivation layer 140 atop the hard dielectric layer 135. In embodiments, the passivation layer 140 comprises photosensitive polyimide (PSPI) that is applied with a spin-on process, CVD, or other suitable process. In accordance with aspects of the invention, the passivation layer 140 is formed with an initial thickness that is sufficient to provide a final thickness (e.g., after curing) of PSPI material of between about 10 μm and about 15 μm at some locations on the chip 110, and a final thickness of about 3 μm to about 4 μm at other locations on the chip 110. As some PSPI materials shrink about 50% during curing, the passivation layer 140 may be initially formed with a layer of uncured PSPI that is about 30 μm thick.

Figure 8:
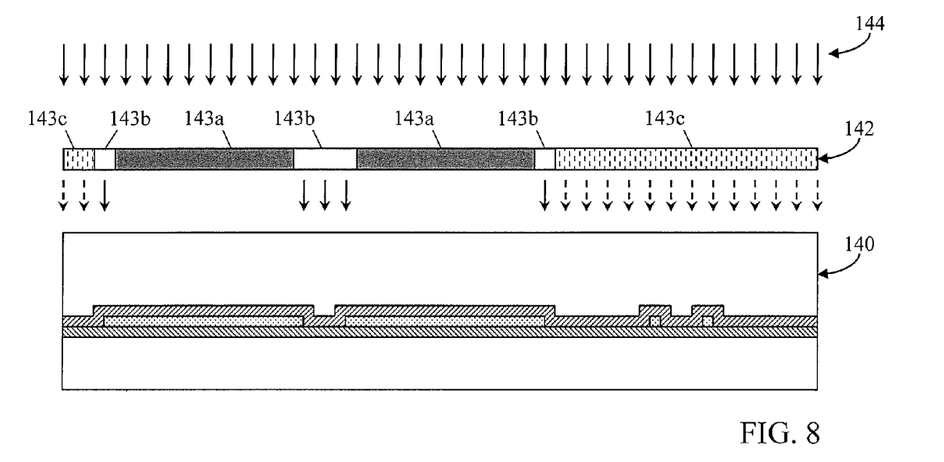

As depicted in FIG. 8, the PSPI material of the passivation layer 140 is exposed using a half-tone or gray-tone mask 142. In embodiments, the mask 142 includes different areas 143a-c that permit different amounts of exposure light 144 to pass through the mask 142 to expose the PSPI material of the passivation layer 140. The different areas may include: first areas 143a where substantially none (e.g., 0%) of the exposure light 144 passes through the mask 142; second areas 143b where substantially all (e.g., 100%) of the exposure light 144 is permitted to pass through the mask 142; and third areas 143c where only a partial amount (e.g., less than 100%) of the exposure light 144 is permitted to pass through the mask 142. In accordance with aspects of the invention, the degree of transmissivity of the third areas 143c may be selected based on the particular PSPI material used in the passivation layer 140 in order to provide any desired final thickness of PSPI material, e.g., after exposing, developing, and curing. In particular embodiments, the transmissivity of the third areas 143c is configured to provide a final thickness of PSPI material of between about 3 μm and about 4 μm.

Figure 9:
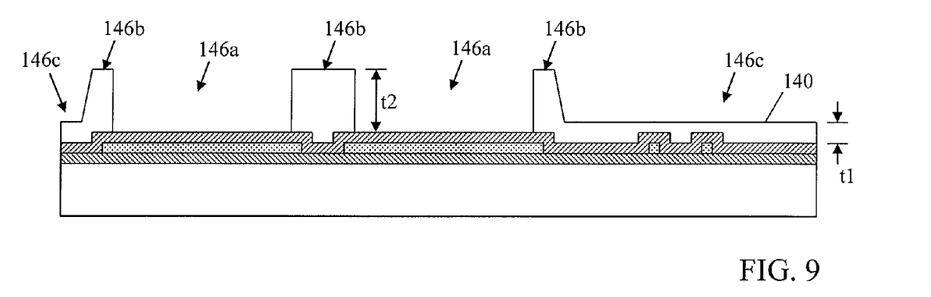

FIG. 9 shows the final shape of the passivation layer 140 after it has been developed and cured (e.g., following the exposing described in FIG. 8). As depicted in FIG. 9, openings 146a are formed where all of the PSPI material is removed as a result of substantially no light passing through mask areas 143a. On the other hand, substantially none of the PSPI material is removed at areas 146b since substantially all of the light was permitted to pass through mask areas 146b. At areas 146c, some but not all of the PSPI material is removed since a partial amount of light was permitted to pass through mask areas 143c.

In this manner, and in accordance with aspects of the invention, a single layer of material and a single masking step are used to provide a passivation layer 140 having openings 146a, first areas 146c of a first thickness t1, and second areas 146b of a second thickness t2. In embodiments, the first thickness t1 is about 3 μm to about 4 μm, and the second thickness t2 is about 10 μm to about 15 μm, although other thicknesses may be achieved by varying at least one of: the initial thickness of the passivation layer 140, the degree of transmissivity of the mask areas 143c, and the particular PSPI material used in the passivation layer 140. In embodiments, the second thickness t2 is at least twice as much as the first thickness t1, and preferably three or four times as much as the first thickness t1.

Figure 10:
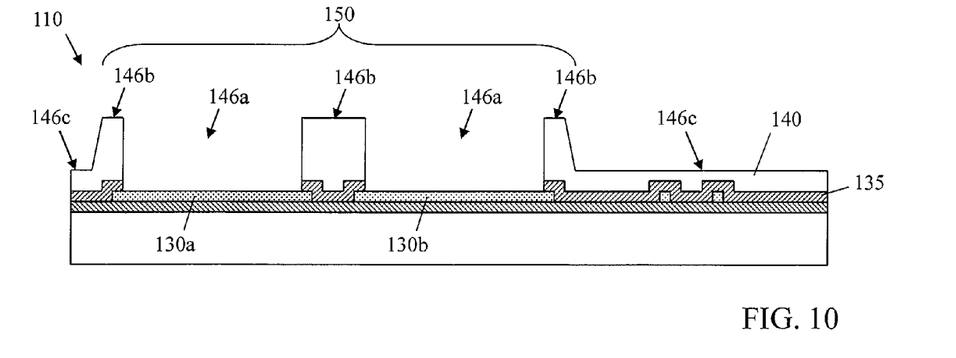

As shown in FIG. 10, portions of the hard dielectric layer 135 are removed through the openings 146a. In embodiments, an etch process, such as a reactive ion etch (RIE) is used to etch the exposed portions of the hard dielectric layer 135, thereby exposing the respective upper surfaces of the bond pads 130a and 130b. Wires may be bonded to the bond pads 130a and 130b, with the localized thick areas 146b of the passivation layer 140 providing a containment structure 150 for any splash that may occur during such wire bonding.

In accordance with aspects of the invention, the localized thick areas 146b of the passivation layer 140 are confined to the areas of the chip 110 adjacent the bond pads, e.g., 130a and 130b, while the remainder of the chip 110 is provided with the thinner areas 146c. This is due in part to the fact that PSPI material typically has a high stress component, such that too thick of a layer of PSPI material across the top of a wafer can cause the wafer to warp. In embodiments, the first areas 146c having the first thickness (e.g., t1) extend over a majority of the chip 110, e.g., over about 95% of the chip 110.

Figure 11:
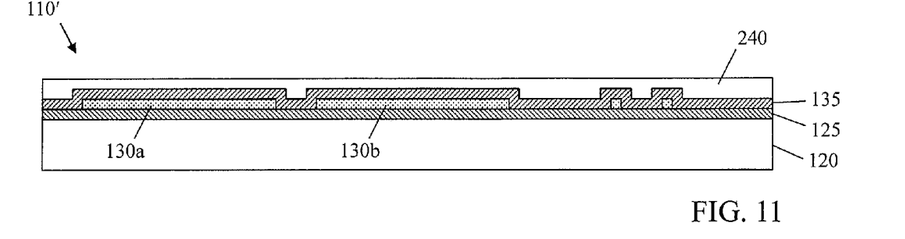

FIGS. 11-17 show processing steps and structures associated with another embodiment of forming a splash containment structure in accordance with aspects of the invention. In particular, FIG. 11 shows a chip 110' comprising a substrate 120, barrier layer 125, bond pads 130a and 130b, and hard dielectric layer 135, which may be formed in the same manner as described above with respect to FIGS. 4-6.

As further shown in FIG. 11, a passivation layer 240 is formed on the hard dielectric layer 135. The passivation layer 240 may be the same material (e.g., PSPI) and formed using the same processes (e.g., spin application, CVD, etc.) as described above with respect to passivation layer 140. Passivation layer 240 is formed with an initial (e.g., uncured) thickness that will result in a final (e.g., cured) thickness of between about 3 μm and about 4 μm.

Figure 12:
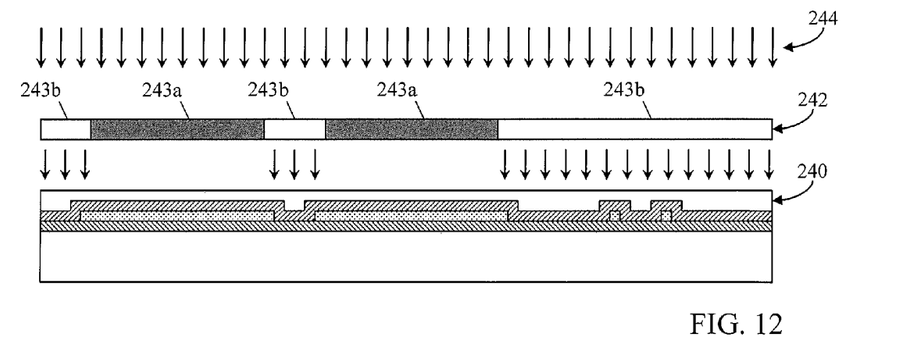

As shown in FIG. 12, portions of the PSPI material of the passivation layer 240 are exposed using a mask 242. In embodiments, the mask 242 includes first areas 243a that block substantially all of the exposure light 244 and second areas 243b that permit substantially all of the exposure light 244 to pass through to expose the PSPI material.

Figure 13:
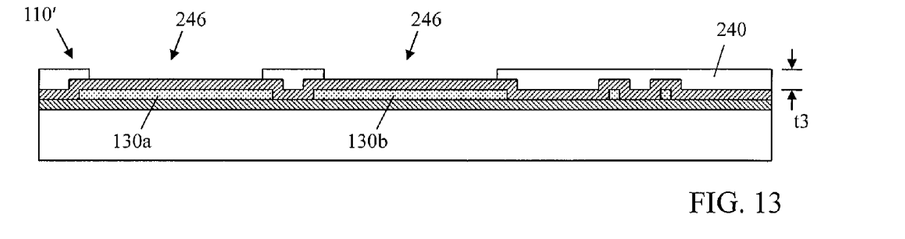

FIG. 13 shows the chip 110' after the PSPI material of the passivation layer 240 has been developed and cured. In particular, the developing removes portions of the passivation layer 240 that correspond to the first areas 243a of the mask 242, i.e., portions of the PSPI material that are not exposed. Moreover, the developing does not remove (i.e., leaves intact) portions of the PSPI material that correspond to the second areas 243b of the mask 242, i.e., portions of the PSPI material that are fully exposed. The removal of portions of PSPI material forms openings 246 in the passivation layer 240 over the bond pads 130a and 130b. In embodiments, the thickness t3 of the passivation layer 240 after curing the PSPI material is between about 3 μm and about 4 μm.

Figure 14:
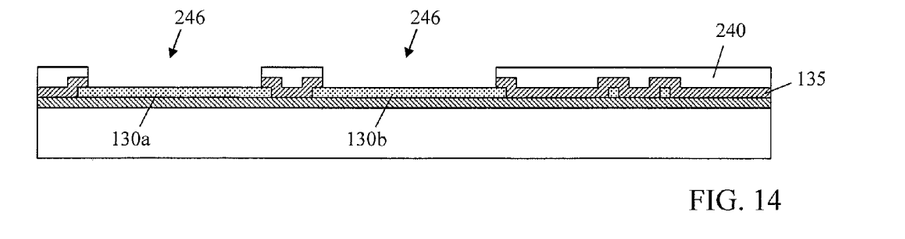

As shown in FIG. 14, the exposed portions of the hard dielectric layer 135 are removed in the area of the openings 246 to expose upper surfaces of the bond pads 130a and 130b. In embodiments, the portions of the hard dielectric layer 135 are removed by etching (e.g., RIE) using the patterned passivation layer 240 as a mask.

Figure 15:
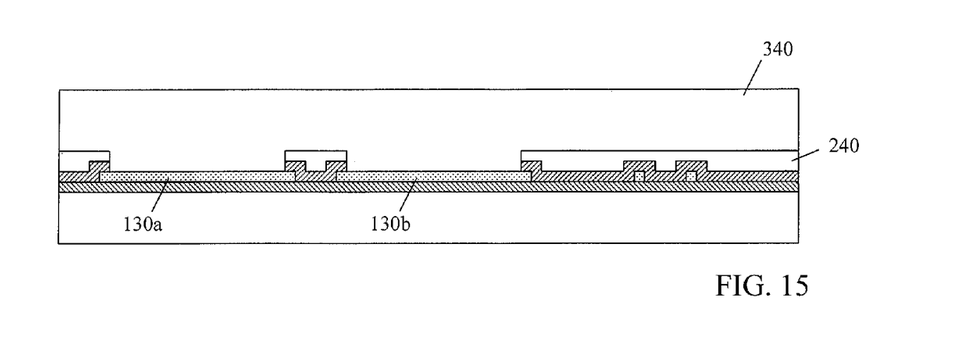

FIG. 15 shows forming a second passivation layer 340 on the patterned passivation layer 240 and on the exposed top surfaces of the bond pads 130a and 130b in accordance with aspects of the invention. The second passivation layer 340 may be the same material (e.g., PSPI) and formed using the same processes (e.g., spin application, CVD, etc.) as described above with respect to passivation layers 140 and 240. In embodiments, the second passivation layer 340 is formed with an initial (e.g., uncured) thickness that will result in a final (e.g., cured) thickness of between about 10 μm and about 15 μm.

Figure 16:
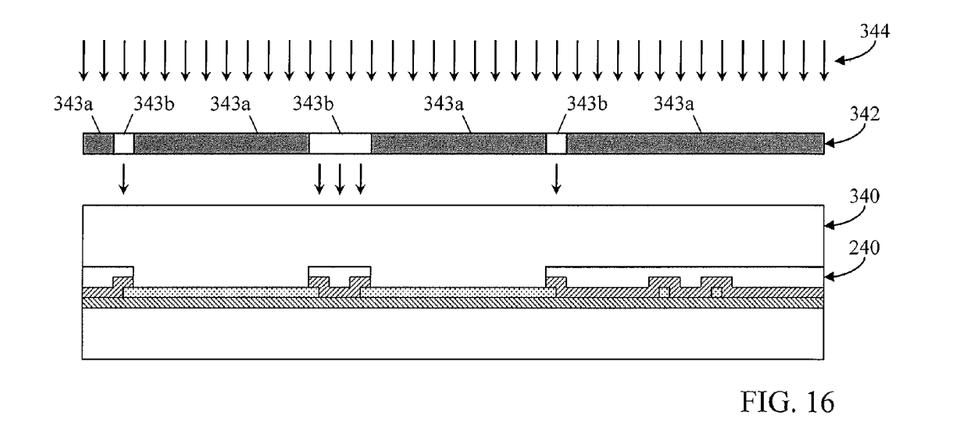

As shown in FIG. 16, portions of the PSPI material of the second passivation layer 340 are exposed using a mask 342. In embodiments, the mask 342 includes first areas 343a that block substantially all of the exposure light 344 and second areas 343b that permit substantially all of the exposure light 344 to pass through to expose the PSPI material of the second passivation layer 340. According to aspects of the invention, the second areas 343b are arranged to correspond to areas adjacent the bond pads 130a and 130b to form a localized thicker layer of PSPI material to form a splash containment structure.

Figure 17:
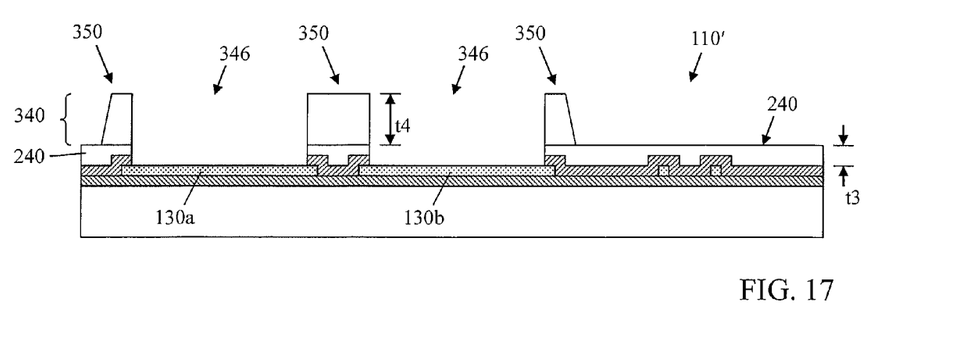

FIG. 17 shows the chip 110' after the PSPI material of the second passivation layer 340 has been developed and cured. In particular, the developing removes portions of the second passivation layer 340 that correspond to first areas 343a of the mask 342, i.e., portions of the PSPI material that are not exposed. Moreover, the developing does not remove (i.e., leaves intact) portions of the second passivation layer 340 that correspond to the second areas 343b of the mask 342, i.e., portions of the PSPI material that are fully exposed. The developing depicted in FIG. 17 does not remove portions of the passivation layer 240 since the PSPI material of this layer has already been cured. The removal of portions of PSPI material forms openings 346 over the bond pads 130a and 130b. In embodiments, the thickness t4 of the second passivation layer 340 after curing the PSPI material is between about 10 μm and about 15 μm. The patterned second passivation layer 340 thus forms a splash containment structure 350 that has a thickness (e.g., t4) that is greater than the thickness of the passivation layer 240 (e.g., t3) that is formed on the remainder of the chip.

Figure 18:
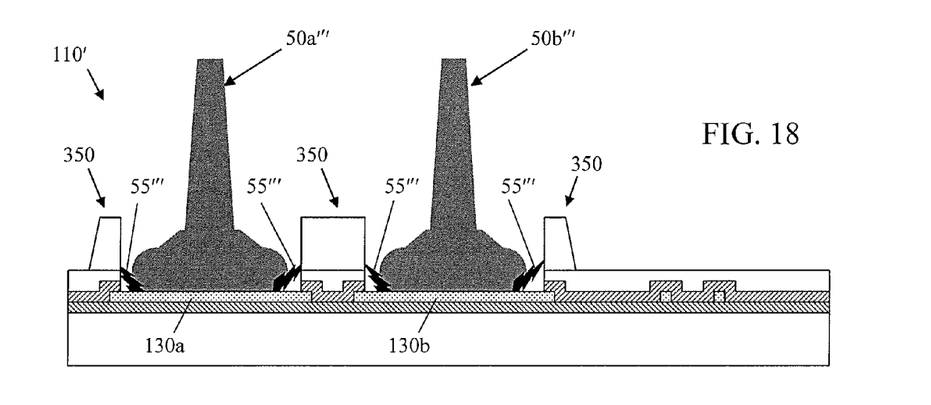

FIG. 18 shows wires 50a''' and 50b''' bonded to the bond pads 130a and 130b of chip 110' in accordance with aspects of the invention. As depicted in FIG. 18, the splash containment structure 350 prevents metal splash 55''' of one bond pad (e.g., 130a) from coming into contact with an adjacent wire (e.g., 50b''') and/or bond pad (e.g., 130b).

Figure 19:
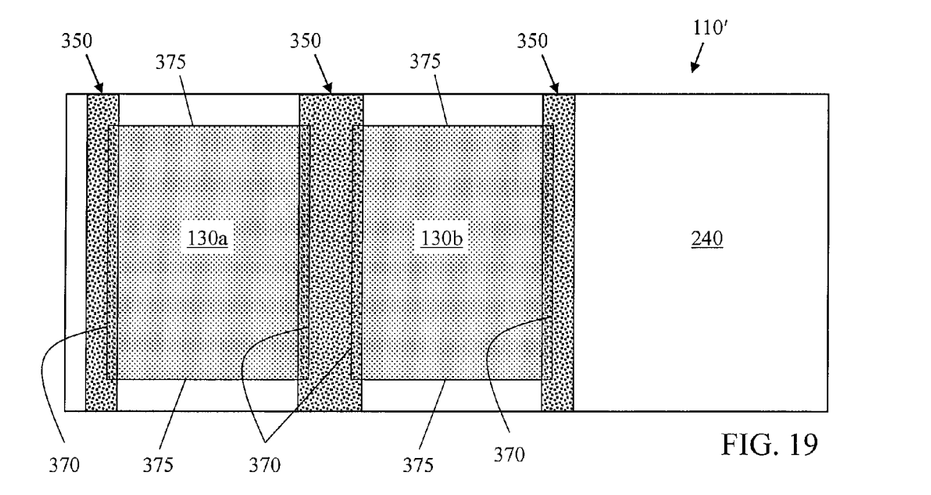

FIG. 19 shows a top-down (e.g., plan) view of the chip 110' of FIG. 17. In embodiments, the splash containment structure 350 is formed along the long edges 370 of each rectangular bond pad 130a and 130b, but not along a majority of the length of the short edges 375. In this manner, the second thickness that defines the splash containment structure 350 is substantially only along the long edges 370. By omitting the splash containment structure 350 along a majority of the length of the short edges 375, a smooth path is provided for overmold compound that is flowed over the entire assembly at later stages in processing.

Figure 20:
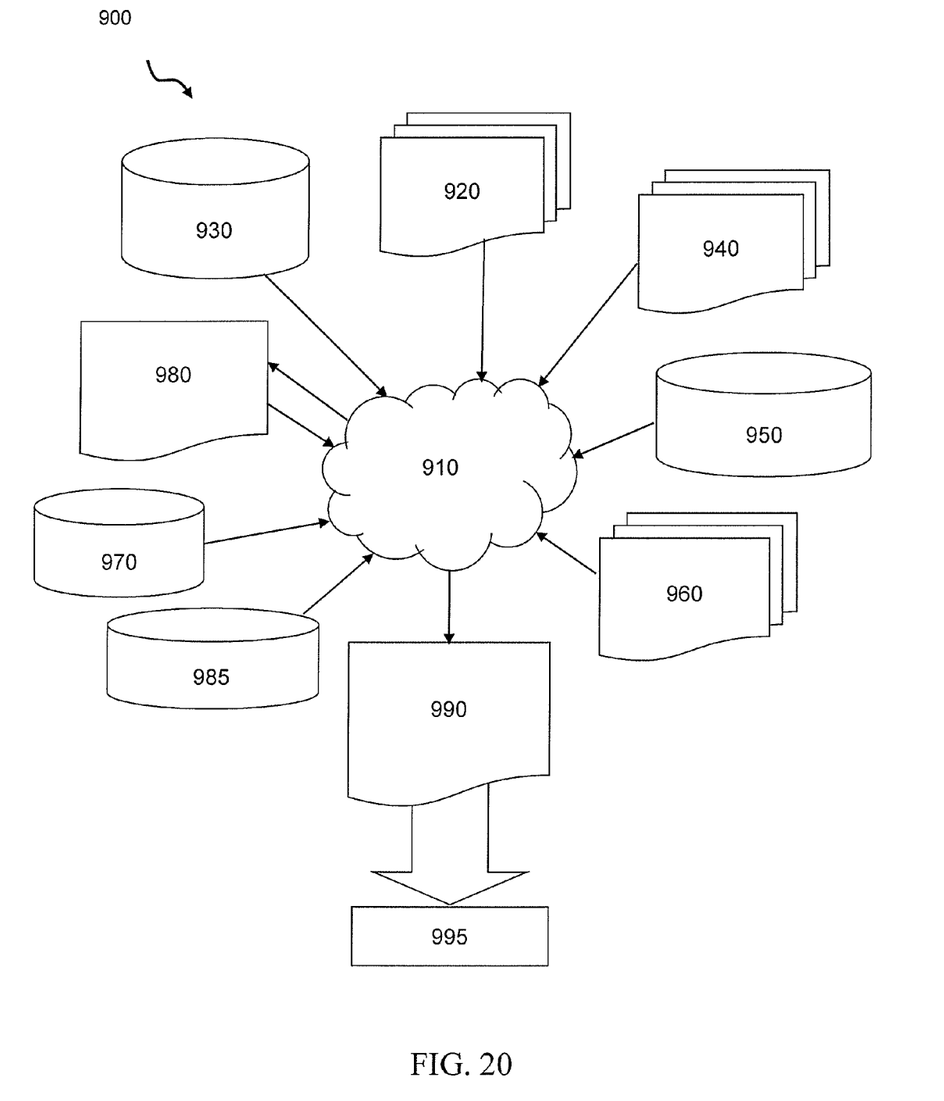
FIG. 20 is a flow diagram of a design process used in semiconductor design, manufacture, and/or test.

FIG. 20 is a flow diagram of a design process used in semiconductor design, manufacture, and/or test. FIG. 20 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 4-19. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4-19. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4-19 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4-19. In one embodiment, design structure 990 may comprise a compiled, executable HDL simulation model that functionally simulates the devices shown in FIGS. 4-19.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4-19. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of manufacturing a semiconductor structure, comprising:
   forming wire bond pads in an integrated circuit chip; and
   forming at least one passivation layer on the chip;
   wherein the at least one passivation layer includes an opening over one of the bond pads, first areas having a first thickness, and second areas having a second thickness;
   the second thickness is greater than the first thickness;
   the first areas having the first thickness extend over a majority of the chip;
   the second areas having the second thickness are adjacent the wire bond pads; and
   a wall of the at least one passivation layer defines the opening and has a height that is greater than the first thickness.

2. The method of claim 1 wherein the at least one passivation layer is a single layer of photosensitive polyimide.

3. The method of claim 2, wherein the first areas having the first thickness and the second areas having the second thickness are formed by exposing portions of the single layer of photosensitive polyimide to different amounts of light.

4. The method of claim 1, wherein the at least one passivation layer comprises first and second layers of photosensitive polyimide.

5. The method of claim 4, wherein:
   the first layer is the first thickness; and
   the second layer is formed on top of the first layer and is the second thickness.

6. The method of claim 1, wherein the second areas having the second thickness are structured and arranged to contain splash that occurs during bonding of a wire to one of the wire bond pads.

7. A method of manufacturing a semiconductor structure, comprising:
   forming wire bond pads in an integrated circuit chip;
   forming a passivation layer over the wire bond pads;
   patterning the passivation layer to form: an area of a first thickness, an area of a second thickness greater than the first thickness, and openings over the wire bond pads,
   wherein the area of the second thickness defines the openings;
   the area of the first thickness extends over a majority of the chip; and
   each of the openings has a sidewall with a height that is greater than the first thickness.

8. The method of claim 7, wherein:
   the forming the passivation layer comprises forming a single layer of photosensitive polyimide; and
   the patterning the passivation layer comprises patterning the single layer of photosensitive polyimide.

9. The method of claim 8, wherein the patterning the single layer of photosensitive polyimide comprises exposing different areas of the photosensitive polyimide to different amounts of light using a mask having different transmissivity areas.

10. The method of claim 9, wherein the different transmissivity areas of the mask include:
    a first transmissivity area of substantially zero transmissivity;
    a second transmissivity area of substantially full transmissivity; and
    a third transmissivity area of partial transmissivity that is greater than the zero transmissivity and less than the full transmissivity.

11. The method of claim 7, wherein:
    the second thickness is at least twice the first thickness; and
    the area of the second thickness forms a splash containment structure around the wire bond pads.

12. The method of claim 7, wherein:
    the wire bond pads are formed in a substantially rectangular shape with long edges and short edges; and the patterning the passivation layer comprises forming the area of the second thickness substantially only along the long edges.

13. A method of manufacturing a semiconductor structure, comprising:
forming wire bond pads in an integrated circuit chip;
forming a first passivation layer over the wire bond pads;
patterning the first passivation layer to form a first area of a first thickness;
forming a second passivation layer on the first area and over the wire bond pads; and
patterning the second passivation layer to form openings over the wire bond pads and a second area of a second thickness, wherein the second area of the second thickness is adjacent the openings, and wherein each of the openings has a sidewall with a height that is greater than the first thickness.

14. The method of claim 13, wherein:
the forming the first passivation layer comprises forming a first layer of photosensitive polyimide; and
the forming the second passivation layer comprises forming a second layer of photosensitive polyimide.

15. The method of claim 14, wherein:
the patterning the first passivation layer comprises exposing the first layer of photosensitive polyimide using a first mask; and
the patterning the second passivation layer comprises exposing the second layer of photosensitive polyimide using a second mask different from the first mask.

16. The method of claim 13, wherein:
the second thickness is at least twice the first thickness; and
the second area of the second thickness forms a splash containment structure around the wire bond pads.

17. The method of claim 13, wherein:
the wire bond pads are formed in a substantially rectangular shape with long edges and short edges; and
the patterning the second passivation layer comprises forming the second area of the second thickness substantially only along the long edges.

18. A semiconductor structure, comprising:
wire bond pads over a substrate in an integrated circuit chip; and
a passivation layer over the substrate, wherein the passivation layer comprises:
a first area having a first thickness extending over a majority of the chip; and
a second area having a second thickness greater than the first thickness and defining openings that are aligned with and over the wire bond pads, wherein each of the openings has a depth that is greater than the first thickness.

19. The structure of claim 18, wherein:
the passivation layer comprises a single layer of photosensitive polyimide; and
the first area and the second area are respective portions of the single layer of photosensitive polyimide.

20. The structure of claim 18, wherein:
the second thickness is at least two times greater than the first thickness; and
the second area defines a splash containment structure around the wire bond pads.

21. The structure of claim 18, further comprising:
a barrier layer on the substrate; and
a hard dielectric layer on the barrier layer,
wherein the bond pads are on the barrier layer; and
the passivation layer is on the hard dielectric layer.

22. A semiconductor structure, comprising:
wire bond pads over a substrate in an integrated circuit chip; and
a first passivation layer over the substrate and having a first area of a first thickness; and
a second passivation layer on the first passivation layer and which defines a second area of a second thickness greater than the first thickness,
wherein the second area of the second thickness defines openings over and aligned with the bond pads, and each of the openings has a depth that is greater than the first thickness.

23. The structure of claim 22, wherein the first area of the first thickness extends over a majority of the chip.

24. The structure of claim 22, wherein:
the second thickness is at least two times greater than the first thickness; and
the second area defines a splash containment structure around the wire bond pads.

25. The structure of claim 22, further comprising:
a barrier layer on the substrate; and
a hard dielectric layer on the barrier layer,
wherein the bond pads are on the barrier layer; and
the first passivation layer is on the hard dielectric layer.

* * * * *